(12) United States Patent
de Rege Thesauro et al.

(10) Patent No.: US 7,563,383 B2
(45) Date of Patent: Jul. 21, 2009

(54) CMP COMPOSITION WITH A POLYMER ADDITIVE FOR POLISHING NOBLE METALS

(75) Inventors: Francesco de Rege Thesauro, Naperville, IL (US); Benjamin P. Bayer, Aurora, IL (US)

(73) Assignee: Cabot Mircroelectronics Corporation, Aurora, IL (US)

( * ) Notice: Subject to any disclaimer, the term of this patent is extended or adjusted under 35 U.S.C. 154(b) by 50 days.

(21) Appl. No.: 10/963,108

(22) Filed: Oct. 12, 2004

(65) Prior Publication Data

US 2006/0076317 A1    Apr. 13, 2006

(51) Int. Cl.
*C03C 15/00* (2006.01)
*C03C 25/68* (2006.01)

(52) U.S. Cl. .......................... 216/88; 216/89; 438/692; 252/79.1; 252/79.2; 252/79.3; 252/79.4; 252/79.5

(58) Field of Classification Search ................. 438/692; 216/88, 89; 252/79.1, 79.2, 79.3, 79.4, 79.5
See application file for complete search history.

(56) References Cited

U.S. PATENT DOCUMENTS

| | | | |
|---|---|---|---|
| 5,196,353 A | 3/1993 | Sandhu et al. | |
| 5,230,833 A | 7/1993 | Romberger et al. | |
| 5,433,651 A | 7/1995 | Lustig et al. | |
| 5,489,233 A | 2/1996 | Cook et al. | |
| 5,527,423 A | 6/1996 | Neville et al. | |
| 5,609,511 A | 3/1997 | Moriyama et al. | |
| 5,643,046 A | 7/1997 | Katakabe et al. | |
| 5,658,183 A | 8/1997 | Sandhu et al. | |
| 5,691,219 A | 11/1997 | Kawakubo et al. | |
| 5,730,642 A | 3/1998 | Sandhu et al. | |
| 5,838,447 A | 11/1998 | Hiyama et al. | |
| 5,872,633 A | 2/1999 | Holzapfel et al. | |
| 5,893,796 A | 4/1999 | Birang et al. | |
| 5,949,927 A | 9/1999 | Tang | |
| 5,958,794 A | 9/1999 | Bruxvoort et al. | |
| 5,964,643 A | 10/1999 | Birang et al. | |
| 6,015,506 A * | 1/2000 | Streinz et al. | ............. 252/186.1 |
| 6,242,351 B1 | 6/2001 | Li et al. | |
| 6,290,736 B1 | 9/2001 | Evans | |
| 6,569,349 B1 | 5/2003 | Wang et al. | |
| 6,604,987 B1 | 8/2003 | Sun | |
| 6,838,383 B2 * | 1/2005 | Miller | .......................... 438/692 |
| 6,974,777 B2 * | 12/2005 | Moeggenborg et al. | ...... 438/692 |
| 2002/0095872 A1 * | 7/2002 | Tsuchiya et al. | .............. 51/307 |
| 2002/0177318 A1 | 11/2002 | Miller | |
| 2003/0051413 A1 * | 3/2003 | Sakai et al. | .................... 51/307 |
| 2003/0102457 A1 | 6/2003 | Miller | |
| 2003/0159362 A1 | 8/2003 | Singh et al. | |
| 2003/0162399 A1 | 8/2003 | Singh | |
| 2003/0194868 A1 | 10/2003 | Miller | |
| 2004/0006924 A1 | 1/2004 | Scott | |
| 2004/0014319 A1 * | 1/2004 | Sahota et al. | ................ 438/692 |
| 2004/0159050 A1 * | 8/2004 | Pasqualoni et al. | ............. 51/307 |
| 2005/0090109 A1 * | 4/2005 | Carter et al. | ................. 438/692 |

FOREIGN PATENT DOCUMENTS

| | | |
|---|---|---|
| WO | WO 00/77107 A1 | 12/2000 |
| WO | WO 03/056620 A1 | 7/2003 |
| WO | WO 03/060028 A1 | 7/2003 |
| WO | WO 03/062338 | 7/2003 |
| WO | WO 03/072683 A1 | 9/2003 |
| WO | WO 2004/031455 | 4/2004 |
| WO | WO 2005/005561 | 1/2005 |
| WO | WO 2005/071031 | 8/2005 |

OTHER PUBLICATIONS

S. Wolf, Silicon Processing for the VLSI Era, vol. 4- Deep Submicron Process Technology, Lattice Press, 2002, p. 382.*
US 6,331,134, 12/2001, Sachan et al. (withdrawn)

* cited by examiner

*Primary Examiner*—Nadine G Norton
*Assistant Examiner*—Mahmoud Dahimene
(74) *Attorney, Agent, or Firm*—Thomas Omholt; Francis J. Koszyk; Steven Weseman

(57) ABSTRACT

The invention provides a method of polishing a substrate comprising contacting a substrate comprising a noble metal on a surface of the substrate with a chemical-mechanical polishing system comprising (a) a polishing component selected from the group consisting of an abrasive, a polishing pad, and a combination thereof, (b) an oxidizing agent, (c) an ethylene-oxide containing polymer, and (d) a liquid carrier, and abrading at least a portion of the noble metal with the chemical-mechanical polishing system to polish the substrate.

18 Claims, No Drawings

CMP COMPOSITION WITH A POLYMER ADDITIVE FOR POLISHING NOBLE METALS

FIELD OF THE INVENTION

This invention pertains to a method of polishing a substrate comprising a noble metal.

BACKGROUND OF THE INVENTION

Compositions and methods for planarizing or polishing the surface of a substrate are well known in the art. Polishing compositions (also known as polishing slurries) typically contain an abrasive material in an aqueous solution and are applied to a surface by contacting the surface with a polishing pad saturated with the slurry composition. Typical abrasive materials include silicon dioxide, cerium oxide, aluminum oxide, zirconium oxide, and tin oxide. U.S. Pat. No. 5,527,423, for example, describes a method for chemically-mechanically polishing a metal layer by contacting the surface with a polishing slurry comprising high purity fine metal oxide particles in an aqueous medium. Alternatively, the abrasive material may be incorporated into the polishing pad. U.S. Pat. No. 5,489,233 discloses the use of polishing pads having a surface texture or pattern, and U.S. Pat. No. 5,958,794 discloses a fixed abrasive polishing pad.

Conventional polishing systems and polishing methods sometimes are not satisfactory at planarizing semiconductor wafers. In particular, polishing compositions and polishing pads can have less than desirable polishing rates, and their use in the chemical-mechanical polishing of semiconductor surfaces can introduce defects into the resulting integrated circuits. Because the yield from a semiconductor wafer is associated with the ability to planarize layers during fabrication without introducing surface defects, it is important to use an effective and efficient polishing system. Manufacturing processes for integrated circuit wafers rely on polishing steps to remove material and planarize the wafer before additional layers are added. The difficulty in creating an effective polishing system for semiconductor wafers stems from the complexity of the semiconductor wafer. Processed semiconductor wafers typically include a plurality of transistors or other semiconductor devices formed over multiple layers together with complex, sometimes multi-metal, conductor patterns used to interconnect the semiconductor devices. Accordingly, polishing steps must be applied to surfaces presenting patterns formed of different materials.

Various metals and metal alloys have been used to form electrical connections between devices, including titanium, titanium nitride, aluminum-copper, aluminum-silicon, copper, tungsten, platinum, platinum-tungsten, platinum-tin, ruthenium, and combinations thereof. Because of their desirable qualities such as inertness, noble metals, including ruthenium, iridium, and platinum, are finding increasing use in memory devices and metal gates. Noble metals, however, present a particular processing challenge at the polishing steps, however. They are mechanically harder and more chemically resistant than many of the other integrated circuit conductor metals. As the noble metals are often used in patterns with other softer and more readily abradable materials, including dielectric materials such as silicon dioxide, problems of selectivity in polishing of the noble metals versus over-polishing of the dielectric materials must be addressed.

Efforts at developing slurries for noble metal polishing are reflected in the patent literature. For example, U.S. Pat. No. 5,691,219 is directed to a semiconductor memory device with a noble metal conductive layer and a polishing composition comprising a halo-compound for polishing the noble metal. U.S. Pat. No. 6,290,736 discloses a chemically active polishing composition for noble metals comprising an abrasive and a halogen in basic aqueous solution. International Application Publication No. WO 00/77107 A1 discloses a polishing composition for noble metals (e.g., Ru, Rh, Pd, Os, Ir, Pt) comprising an abrasive, a liquid carrier, an oxidizer, and a polishing additive that can include EDTA, nitrogen-containing macrocycles (e.g., tetraazacyclotetradecanes), crown ethers, halides, cyanides, citric acid, phosphines, and phosphonates. With regard to polishing-slurries suggested for polishing other conductor patterns, e.g. tantalum, International Application Publication No. WO 03/072683 A1 is directed to a chemical-mechanical polishing slurry having particles surrounded by a shell formed of an adsorption additive.

A need remains for improved, cost-effective polishing systems and polishing methods that will exhibit desirable planarization efficiency, material selectivity, and defect abatement. The invention provides such a method. These and other advantages of the invention, as well as additional inventive features, will be apparent from the description of the invention provided herein.

BRIEF SUMMARY OF THE INVENTION

The invention provides a method of polishing a substrate comprising (i) contacting a substrate comprising a noble metal on a surface of the substrate with a chemical-mechanical polishing system comprising (a) a polishing component selected from the group consisting of an abrasive, a polishing pad, and a combination thereof, (b) an oxidizing agent selected from the group consisting of bromates, bromites, hypobromites, chlorates, chlorites, hypochlorites, perchlorates, hypoiodites, periodates, organo-halo-oxy compounds, rare earth salts, and combinations thereof, (c) an ethylene-oxide containing polymer, and (d) a liquid carrier, and (ii) abrading at least a portion of the noble metal with the chemical-mechanical polishing system to polish the substrate.

DETAILED DESCRIPTION OF THE INVENTION

The invention provides a method of polishing a substrate comprising a noble metal on a surface of a substrate. The method of polishing involves (i) contacting a substrate comprising a noble metal on a surface of a substrate with a chemical-mechanical polishing system comprising a polishing component, an oxidizing agent, an ethylene oxide-containing polymer, and a liquid carrier, and (ii) abrading at least a portion of the noble metal with the chemical-mechanical polishing system to polish the substrate.

The polishing system comprises a polishing component selected from the group consisting of an abrasive, a polishing pad, and a combination thereof. The polishing system described herein desirably comprises an abrasive and a polishing pad. The abrasive can be in any suitable form (e.g., abrasive particles). The abrasive can be in particulate form and suspended in the liquid carrier and/or can be fixed on the polishing pad. The polishing pad can be any suitable polishing pad. The abrasive (when suspended in the liquid carrier), the oxidizing agent, and the ethylene-oxide containing polymer, as well as any other components suspended in the liquid carrier, form the polishing composition of the chemical-mechanical polishing (e.g., CMP) system.

When an abrasive is present and desirably is suspended in the liquid carrier of the polishing composition, the abrasive can be any suitable abrasive, many of which are well known in the art. For example, the abrasive can be natural or synthetic, and can comprise certain hard polymers (e.g., polycarbonates), diamond (e.g., polycrystalline diamond), garnet, glass, carborundum, metal oxide, carbide, nitride, and the like. The abrasive preferably comprises a metal oxide or diamond. Suitable metal oxides include metal oxides selected from the group consisting of alumina, silica, ceria, zirconia, titania, germania, co-formed products thereof, and combinations thereof. Preferably, the metal oxide is silica or alumina-doped silica.

The silica can be any suitable form of silica. Suitable forms of silica include fumed silica and colloidal silica. Fumed silica is typically prepared by a pyrogenic process, in which a suitable-precursor, such as silicon tetrachloride, undergoes vapor phase hydrolysis at high temperatures. Colloidal silica useful in the context of the invention includes wet-process type silica particles (e.g., condensation-polymerized silica particles). Condensation-polymerized silica particles typically are prepared by condensing $Si(OH)_4$ to form colloidal particles, where colloidal is defined as having an average particle size between about 1 nm and about 1000 nm. Such abrasive particles can be prepared in accordance with U.S. Pat. No. 5,230,833 or can be obtained as any of various commercially available products, such as the Akzo-Nobel Bindzil 50/80 product and the Nalco 1050, 2327, and 2329 products, as well as other similar products available from DuPont, Bayer, Applied Research, Nissan Chemical, and Clariant.

Another preferred abrasive is a doped silica, for example, alumina-doped silica. Alumina-doped silicas are typically prepared by a co-fuming process in which mixtures of silicon tetrachloride and aluminum chloride are subjected to vapor phase hydrolysis. Examples of alumina-doped silicas are the MOX 80 and MOX 170 products (both containing about 1% alumina) available from Degussa.

When an abrasive is present in the polishing composition, the abrasive particles typically have an average particle size (e.g., average particle diameter) of about 20 nm to about 500 nm. Preferably, the abrasive particles have an average particle size of about 70 nm to about 300 nm (e.g., about 100 nm to about 200 nm).

The abrasive can be present in any suitable amount. Typically, about 0.001 wt. % or more abrasive (e.g., about 0.01 wt. % or more) can be present in the polishing composition. The amount of abrasive in the polishing composition preferably will not exceed about 20 wt. %, and more preferably will not exceed about 10 wt. % (e.g., will not exceed about 5 wt. %). Even more preferably, the amount of the abrasive will be about 0.01 wt. % to about 5 wt. % of the polishing composition.

The abrasive desirably is suspended in the polishing composition, more specifically in the liquid carrier of the polishing composition. When the abrasive is suspended in the polishing composition, the abrasive preferably is colloidally stable. The term colloid refers to the suspension of abrasive particles in the liquid carrier. Colloidal stability refers to the maintenance of that suspension over time. In the context of this invention, an abrasive is considered colloidally stable if, when the abrasive is placed into a 100 ml graduated cylinder and allowed to stand unagitated for a time of 2 hours, the difference between the concentration of particles in the bottom 50 ml of the graduated cylinder ([B] in terms of g/ml) and the concentration of particles in the top 50 ml of the graduated cylinder ([T] in terms of g/ml) divided by the initial concentration of particles in the abrasive composition ([C] in terms of g/ml) is less than or equal to 0.5 (i.e., $\{[B]-[T]\}/[C] \leq 0.5$). The value of [B]-[T]/[C] desirably is less than or equal to 0.3, and preferably is less than or equal to 0.1.

The oxidizing agent preferably is selected from the group consisting of bromates, bromites, hypobromites, chlorates, chlorites, hypochlorites, perchlorates, hypoiodites, periodates, monoperoxy sulfate, organo-halo-oxy compounds, rare earth salts, and combinations thereof. As utilized herein, the term "organo-halo-oxy compound" is used to refer to oxidizing agents which contain at least one organic functional group, at least one halogen atom, and at least one oxygen atom. The organic functional group(s), halogen atom(s), and oxygen atom(s) of the organo-halo-oxy compound can be arranged in any suitable manner, but will conform to one of three general formulas: $R_a$—X—$O_b$, $R_a$—$O_b$—X, or $O_b$—$R_a$—X, wherein R represents an organic functional group, X represents a halogen atom, and a and b are integers greater than or equal to one. Suitable organo-halo-oxy compounds include, but are not limited to, N-chlorosuccinimide, N-bromosuccinimide, N-bromoacetamide, N-bromobenzophenoneimine, iodine triacetate, iodine tris(trifluoroacetate), iodobenzene diacetate, pentafluoroiodobenzene bis (trifluoroacetate), iodosobenzene, iodoxybenzene, iodoxybenzoic acid (e.g., m-iodoxybenzoic acid), salts thereof, and combinations thereof. More preferably, the oxidizing agent is potassium bromate or potassium hydrogen peroxymonosulfate sulfate (which is commercially available under the trade name of Oxone® from DuPont).

The polishing composition can comprise any suitable amount of the oxidizing agent. Typically, the polishing composition comprises about 0.1 wt. % or more (e.g., about 0.2 wt. % or more, or about 0.5 wt. % or more, or about 1 wt. % or more) oxidizing agent, based on the weight of the liquid carrier and any components dissolved or suspended therein. The polishing composition preferably comprises about 20 wt. % or less (e.g., about 15 wt. % or less, or about 10 wt. % or less) oxidizing agent, based on the weight of the liquid carrier and any components dissolved or suspended therein. Even more preferably, the polishing composition comprises about 0.1 wt. % to about 10 wt. % of the oxidizing agent.

The polishing composition comprises an ethylene-oxide containing polymer. The purpose of the ethylene-oxide containing polymer is to reduce the polishing rate for the portion of the substrate that is not a noble metal. Typically, the substrate portion that is not a noble metal is mechanically softer than the noble metal and experiences excessive mechanical abrasion by a polishing composition suitable for polishing of a noble metal. Without wishing to be bound by any particular theory, it is believed that the ethylene-oxide containing polymer is adsorbed onto the portion of the substrate surface that is not a noble metal, thus forming a lubricating film.

A typical disadvantage to the presence of polymers in the polishing system is reduction of the removal rate for the noble metal. The absorption of polymers onto the metal surface acts to reduce the contact of the oxidizing agent, the abrasive particles, and other components of the polishing system with the metal surface, thus reducing the removal rate, often below useful rates, which limits the usefulness of polymers in polishing compositions for noble metals. However, the presence of an ethylene-oxide containing polymer in the context of the inventive polishing composition advantageously allows for useful removal rates for the noble metals while reducing removal rates for the remainder of the substrate.

The ethylene-oxide containing polymer desirably is compatible with the other components of the polishing system (e.g., the oxidizing agent, the pH adjustor, and the like).

The ethylene-oxide containing polymer can be any suitable polymer comprising ethylene-oxide units. When the ethylene-oxide containing polymer consists essentially of ethylene oxide repeating units, the ethylene-oxide containing polymer typically comprises the structure $R(CH_2CH_2O)_nR'$, wherein R can be OH, OR", or R" wherein R" is H or lower alkyl, R' can be H or R", and n can be an integer from about 150 to about 250. Preferably, R'is H. More preferably, R is OH and R' is H. Suitable ethylene-oxide containing polymers include polyethylene glycols. Preferably, the polyethylene glycols have a molecular weight of from about 7,500 Daltons to about 10,000 Daltons. If the molecular weight of the polyethylene glycols is too low, then no advantage is obtained with the use of the polyethylene glycols. If the molecular weight of the polyethylene glycols is too large, the removal rate of the noble metal is reduced to impractically low levels.

The ethylene-oxide containing polymer can be any suitable block copolymer comprising dialkylsiloxane blocks and polyethylene oxide blocks. The dialkylsiloxane-ethylene oxide block copolymer can be an AB diblock or ABA triblock copolymer. The dialkylsiloxane-ethylene oxide block copolymer also can be a graft copolymer. Typically, the dialkylsiloxane-ethylene oxide block copolymer comprises about 50% or more (e.g., about 60% or more, or about 70% or more) of polyethylene oxide blocks. The alkyl groups of the dialkylsiloxane blocks can be any suitable alkyl groups. Preferably, the alkyl groups of the dialkylsiloxane blocks are methyl groups. Desirably, the dialkylsiloxane-ethylene oxide block copolymer will have at least one end group (e.g., a functional group on the terminus of a polymeric chain) that is OH.

The polishing composition can comprise any suitable amount of the ethylene-oxide containing polymer. The amount of ethylene-oxide containing polymer typically is about 0.01 wt. % or more (e.g., about 0.05 wt. % or more, or about 0.1 wt. % or more) based on the weight of the liquid carrier and any components dissolved or suspended therein. Preferably, the amount of ethylene-oxide containing polymer is about 10 wt. % or less (e.g., about 5 wt. % or less, or about 2.5 wt. % or less) based on the weight of the liquid carrier and any components dissolved or suspended therein.

The substrate can comprise any suitable noble metal. Suitable noble metals include but are not limited to ruthenium, iridium, platinum, palladium, osmium, rhenium, silver, gold, nitrides thereof, oxides thereof, alloys thereof, and combinations thereof. Preferably, the noble metal comprises ruthenium.

The substrate can further comprise any suitable material. Suitable materials include silicon oxide, an adhesion-promoting layer such as titanium or tantalum, and/or a diffusion barrier layer such as titanium nitride or tantalum nitride, or other high- or low-κ dielectric materials. Preferably, the substrate comprises silicon oxide.

The chemical-mechanical polishing system can have any suitable pH. Typically, the polishing system has a pH of about 1 or more (e.g., about 2 or more). Preferably, the polishing system has a pH of about 6 or less (e.g., about 5 or less, or about 4 or less). More preferably, the polishing system has a pH of about 1 to about 4.

The pH of the polishing system can be achieved and/or maintained by any suitable means. More specifically, the polishing composition can further comprise a pH adjustor, a pH buffering agent, or a combination thereof. The pH adjustor can be any suitable pH-adjusting compound. For example, the pH adjustor can be nitric acid, potassium hydroxide, or a combination thereof. The pH buffering agent can be any suitable buffering agent, for example, phosphates, sulfates, hydrogen phthalates, and the like. The polishing composition can comprise any suitable amount of a pH adjustor and/or a pH buffering agent, e.g., to achieve and/or maintain the pH of the polishing system within the ranges set forth.

A liquid carrier is used to facilitate the application of the components of the polishing composition to the surface of a suitable substrate to be polished. The liquid carrier can be any suitable liquid carrier. Typically, the liquid carrier is water, a mixture of water and a suitable water-miscible solvent, or an emulsion. Preferably, the liquid carrier comprises, consists essentially of, or consists of water, more preferably deionized water.

The polishing system optionally further comprises a complexing agent. The complexing agent is any suitable chemical additive that enhances the removal rate of the substrate layer being removed. Suitable chelating or complexing agents can include, for example, carbonyl compounds (e.g., acetylacetonates, and the like), simple carboxylates (e.g., acetates, aryl carboxylates, and the like), carboxylates containing one or more hydroxyl groups (e.g., glycolates, lactates, gluconates, gallic acid and salts thereof, and the like), di-, tri-, and polycarboxylates (e.g., oxalates, phthalates, citrates, succinates, tartrates, malates, edetates (e.g., dipotassium EDTA), mixtures thereof, and the like), carboxylates containing one or more sulfonic and/or phosphonic groups, and the like. Suitable chelating or complexing agents also can include, for example, di-, tri-, or polyalcohols (e.g., ethylene glycol, pyrocatechol, pyrogallol, tannic acid, and the like) and amine-containing compounds (e.g., ammonia, amino acids, amino alcohols, di-, tri-, and polyamines, and the like). Preferably, the complexing agent is selected from the group consisting of ethylenediaminetetraacetic acid, nitrogen-containing crown ethers, citric acid, chloride ligands, bromide ligands, cyanide ligands, and phosphine ligands. The choice of chelating or complexing agent will depend on the type of substrate layer being removed.

The polishing composition optionally further comprises an antifoaming agent. The anti-foaming agent can be any suitable anti-foaming agent and can be present in the polishing composition in any suitable amount. Suitable antifoaming agents include, but are not limited to, silicon-based and acetylenic diol-based antifoaming agents. The amount of antifoaming agent present in the polishing composition typically is about 40 ppm to about 140 ppm.

The polishing composition optionally further comprises a biocide. The biocide can be any suitable biocide and can be present in the polishing composition in any suitable amount. A suitable biocide is an isothiazolinone biocide. The amount of biocide used in the polishing composition typically is about 1 to about 50 ppm, preferably about 10 to about 20 ppm.

A substrate can be planarized or polished with the polishing composition described herein and/or in accordance with the inventive method described herein by any suitable technique. The polishing method of the invention is particularly suited for use in conjunction with a chemical-mechanical polishing (CMP) apparatus. Typically, the apparatus comprises a platen, which, when in use, is in motion and has a velocity that results from orbital, linear, or circular motion, a polishing pad in contact with the platen and moving with the platen when in motion, and a carrier that holds a substrate to be polished by contacting and moving relative to the surface of the polishing pad. The polishing of the substrate takes place by the substrate being placed in contact with the polishing pad and the polishing composition of the invention and then the polishing pad moving relative to the substrate, so as to abrade at least a portion of the substrate to polish the substrate.

The polishing composition can be produced by any suitable technique, many of which are known to those skilled in the art. The polishing composition can be prepared in a batch or continuous process. Generally, the polishing composition is prepared by combining the components of the polishing composition. The term "component" as used herein includes individual ingredients (e.g., abrasives, acids, oxidizing agents, ethylene-oxide containing polymer, etc.) as well as any combination of ingredients (e.g., abrasives, oxidizing agents, etc.).

For example, the polishing composition can be prepared by (i) providing all or a portion of the liquid carrier, (ii) dispersing the oxidizing agent and ethylene-oxide containing polymer, along with the optional abrasive, using any suitable means for preparing such a dispersion, (iii) adjusting the pH of the dispersion as appropriate, and (iv) optionally adding suitable amounts of a complexing agent, other optional components, or combinations thereof to the mixture.

The polishing composition can be supplied as a one-package system comprising an abrasive, an oxidizing agent, an ethylene-oxide containing polymer, and a liquid carrier.

Alternatively, the abrasive can be supplied as a dispersion in a liquid carrier in a first container, and an oxidizing agent and an ethylene-oxide containing polymer can be supplied in a second container, either in dry form, or as a solution or dispersion in the liquid carrier. Optional components, such as a complexing agent, can be placed in the first and/or second containers or a third container. Furthermore, the components in the first or second container can be in dry form while the components in the corresponding container can be in the form of an aqueous dispersion. Moreover, it is suitable for the components in the first or second containers to have different pH values, or alternatively to have substantially similar, or even equal, pH values. If an optional component such as a complexing agent is a solid, it may be supplied either in dry form or as a mixture in the liquid carrier. The oxidizing agent desirably is supplied separately from the other components of the polishing composition and is combined, e.g., by the end-user, with the other components of the polishing composition shortly before use (e.g., 1 week or less prior to use, 1 day or less prior to use, 1 hour or less prior to use, 10 minutes or less prior to use, or 1 minute or less prior to use). Other two-container, or three or more container, combinations of the components of the polishing composition are within the knowledge of one of ordinary skill in the art.

In certain embodiments, the pH of the polishing system is preferably less than about 4. For polishing systems comprising silica and having a pH of less than about 4, the silica and the ethylene-oxide containing polymer may form agglomerates over time. In this event, it is preferable to provide the polishing composition as a two-component system, wherein one component comprises a mixture of silica and the ethylene-oxide containing polymer at a pH of about 4 or more, and the second component comprises the oxidizing agent at a pH of about 4 or less. Optional ingredients, such as a complexing agent, can be present in the first or second component, or even in both components. The two components are then preferably mixed either shortly before use (e.g., about 1 day before use, or about 12 hours before use, or about 6 hours before use, or even minutes before use), or at the point-of-use, to provide a polishing system with a pH of about 4 or less.

As utilized herein, the term "point-of-use" refers to the point at which the polishing composition is applied to the substrate surface (e.g., the polishing pad or the substrate surface itself). When the polishing composition is to be produced using point-of-use mixing, the components of the polishing composition are separately stored in two or more storage devices.

In order to mix components contained in storage devices to produce the polishing composition at or near the point-of-use, the storage devices typically are provided with one or more flow lines leading from each storage device to the point-of-use of the polishing composition (e.g., the platen, the polishing pad, or the substrate surface). By the term "flow line" is meant a path of flow from an individual storage container to the point-of-use of the component stored therein. The one or more flow lines can each lead directly to the point-of-use, or, in the case that more than one flow line is used, two or more of the flow lines can be combined at any point into a single flow line that leads to the point-of-use. Furthermore, any of the one or more flow lines (e.g., the individual flow lines or a combined flow line) can first lead to one or more of the other devices (e.g., pumping device, measuring device, mixing device, etc.) prior to reaching the point-of-use of the component(s).

The components of the polishing composition can be delivered to the point-of-use independently (e.g., the components are delivered to the substrate surface whereupon the components are mixed during the polishing process), or the components can be combined immediately before delivery to the point-of-use. Components are combined "immediately before delivery to the point-of-use" if they are combined less than 10 seconds prior to reaching the point-of-use, preferably less than 5 seconds prior to reaching the point-of-use, more preferably less than 1 second prior to reaching the point of use, or even simultaneous to the delivery of the components at the point-of-use (e.g., the components are combined at a dispenser). Components also are combined "immediately before delivery to the point-of-use" if they are combined within 5 m of the point-of-use, such as within 1 m of the point-of-use or even within 10 cm of the point-of-use (e.g., within 1 cm of the point of use).

When two or more of the components of the polishing composition are combined prior to reaching the point-of-use, the components can be combined in the flow line and delivered to the point-of-use without the use of a mixing device. Alternatively, one or more of the flow lines can lead into a mixing device to facilitate the combination of two or more of the components. Any suitable mixing device can be used. For example, the mixing device can be a nozzle or jet (e.g., a high pressure nozzle or jet) through which two or more of the components flow. Alternatively, the mixing device can be a container-type mixing device comprising one or more inlets by which two or more components of the polishing slurry are introduced to the mixer, and at least one outlet through which the mixed components exit the mixer to be delivered to the point-of-use, either directly or via other elements of the apparatus (e.g., via one or more flow lines). Furthermore, the mixing device can comprise more than one chamber, each chamber having at least one inlet and at least one outlet, wherein two or more components are combined in each chamber. If a container-type mixing device is used, the mixing device preferably comprises a mixing mechanism to further facilitate the combination of the components. Mixing mechanisms are generally known in the art and include stirrers, blenders, agitators, paddled baffles, gas sparger systems, vibrators, etc.

A substrate can be planarized or polished with the polishing composition with any suitable polishing pad (e.g., polishing surface). Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, coformed products thereof, and mixtures thereof.

Desirably, the CMP apparatus further comprises an in situ polishing endpoint detection system, many of which are known in the art. Techniques for inspecting and monitoring the polishing process by analyzing light or other radiation reflected from a surface of the workpiece are known in the art. Such methods are described, for example, in U.S. Pat. Nos. 5,196,353, 5,433,651, 5,609,511, 5,643,046, 5,658,183, 5,730,642, 5,838,447, 5,872,633, 5,893,796, 5,949,927, and 5,964,643. Desirably, the inspection or monitoring of the progress of the polishing process with respect to a workpiece being polished enables the determination of the polishing end-point, i.e., the determination of when to terminate the polishing process with respect to a particular workpiece.

EXAMPLES

The following examples further illustrate the invention but, of course, should not be construed as in any way limiting its scope.

In each of these examples, the polishing experiments generally involved the use of a commercially available polishing apparatus equipped with a concentric groove pad over a sub pad. The polishing parameters generally were 20.7 kPa (3 psi) downforce pressure of the substrate against the polishing pad, 126 rpm platen speed, 121 rpm carrier speed, and 150 mL/min polishing composition flow rate, except for Example 4. In Example 4, the polishing composition was delivered via two flow streams instead of one, at flow rates as noted therein. In these examples, the term oxide is synonymous with silicon dioxide.

Example 1

This example demonstrates the effect of the addition of polyethylene glycol to a polishing composition containing an alumina-doped silica abrasive on the polishing of a ruthenium-containing substrate.

Two similar substrates comprising ruthenium and silicon dioxide were chemically-mechanically polished with different polishing compositions (Polishing Compositions 1A and 1B). Each polishing composition was prepared as a batch mixture 1 to 4 hours before the polishing experiments. Polishing Composition 1A (comparative) contained 1% Degussa MOX-80 abrasive particles (1% alumina-doped silica) and 5% potassium bromate in water, adjusted to pH 2 with nitric acid. Polishing Composition 1B (invention) was the same as Polishing Composition 1A except that it further contained 0.25 wt. % of polyethylene glycol with a molecular weight of 8000 Daltons.

Following use of the polishing compositions, the ruthenium removal rate (Ru RR) and silicon dioxide removal rate (oxide RR) were determined for both of the chemical-mechanical polishing compositions. The results are summarized in Table 1.

TABLE 1

Effect of Polyethylene Glycol in Alumina-Doped Silica-Containing Polishing Compositions

| Polishing Composition | Ru RR (Å/min) | Oxide RR (Å/min) | Selectivity Ru/Ox |
|---|---|---|---|
| 1A (comparative) | 168 | 35 | 5 |
| 1B (invention) | 174 | 3 | 70 |

As is apparent from the results set forth in Table 1, the presence of 0.25 wt. % of polyethylene glycol with a molecular weight of 8000 Daltons resulted in a slight increase in the ruthenium removal rate. However, the oxide removal rate was decreased more than ten-fold. The selectivity for ruthenium polishing versus oxide polishing as measured by the ratio of ruthenium removal rate to oxide removal rate increased by a factor of approximately 14.

Example 2

This example demonstrates the effect of different polishing additives on removal rates for ruthenium and for oxide observed with the polishing method of the invention. Similar substrates comprising ruthenium and silicon dioxide were polished with different polishing compositions. Seven different polishing compositions were used to chemically-mechanically polish the substrates (Compositions 2A, 2B, 2C, 2D, 2E, 2F, and 2G). Each of the compositions comprised 1 wt. % fumed silica and 5 wt. % potassium bromide, and was adjusted to pH 2 with nitric acid. Composition 2A (control) did not contain any other components. Composition 2B (invention) additionally contained 0.025 wt. % DBE-821 (a dimethylsiloxane-ethylene oxide block copolymer). Composition 2C (invention) additionally contained 0.25 wt. % DBE-821. Composition 2D (comparative) additionally contained 0.010 wt. % potassium polyvinyl sulfate. Composition 2E (comparative) additionally contained 0.10 wt. % polyacrylic acid. Composition 2F (comparative) additionally contained 0.10 wt. % sodium dodecylsulfate. Composition 2G (comparative) additionally contained contained 0.005 wt. % cetyltrimethylammonium bromide.

Following use of the polishing compositions, the ruthenium removal rate (Ru RR) and silicon dioxide removal rate (oxide RR) were determined for each of the chemical-mechanical polishing compositions. The results are set forth in Table 2.

TABLE 2

Effect of Various Polymers on Ruthenium and Oxide Polishing

| Polishing Composition | Ru RR (Å/min) | Oxide RR (Å/min) | Selectivity Ru/Ox |
|---|---|---|---|
| 2A (control) | 369 | 38 | 10 |
| 2B (invention) | 341 | 17 | 20 |
| 2C (invention) | 207 | 1 | 243 |
| 2D (comparative) | 444 | 36 | 12 |
| 2E (comparative) | 209 | 33 | 6 |
| 2F (comparative) | 449 | 36 | 12 |
| 2G (comparative) | 32 | 32 | 1 |

As is apparent from the results set forth in Table 2, the addition of 0.025 wt. % DBE-821, a dimethylsiloxane-ethylene oxide block copolymer, to the polishing composition (Polishing Composition 2B) resulted in an approximately 2-fold decrease in oxide removal rate with an approximately 8% decrease in ruthenium removal rate as compared to the control. Increasing the amount of DBE-821 to 0.25 wt. % in the polishing composition (Polishing Composition 2C) caused the ruthenium removal rate to decrease approximately 44% and decreased the oxide removal rate approximately 17-fold, corresponding to a ruthenium/oxide removal rate ratio of about 243. In contrast, the comparative polishing compositions (Polishing Compositions 2D, 2E, 2F, and 2G) did not exhibit ruthenium/oxide removal rate ratios of greater than 12.

Example 3

This example demonstrates the effect of the molecular weight of polyethylene glycol on the ruthenium removal rate and the effect of increasing the concentration of polyethylene glycol in the polishing system. Similar substrates comprising ruthenium and silicon dioxide were polished with different polishing compositions. Seven different polishing compositions were used to chemically-mechanically polish the substrates (Compositions 3A, 3B, 3C, 3D, 3E, 3F, and 3G). Each of the compositions comprised 1 wt. % Degussa MOX-80 abrasive particles (1% aluminum-doped silica) and 4 wt. % potassium bromate, and was adjusted to pH 2 with nitric acid. Polishing Composition 3A (control) did not contain any other components. Polishing Compositions 3B-3G (invention) additionally contained polyethylene glycols with molecular weights and at concentrations as set forth in Table 3.

Following use of the polishing compositions, the ruthenium removal rate (Ru RR) and silicon dioxide removal rate (oxide RR) were determined for each of the chemical-mechanical polishing compositions. The results are set forth in Table 3.

TABLE 3

Effect of Molecular Weight and Concentration of Polyethylene Glycol on Ruthenium and Oxide Polishing

| Polishing Composition | Polymer Molecular Weight | Polymer Concentration (wt. %) | Ru RR (Å/min) | Oxide RR (Å/min) | Selectivity Ru/Ox |
|---|---|---|---|---|---|
| 3A (control) | None | None | 275 | 49 | 6 |
| 3B (invention) | 1000 | 0.25 | 282 | 25 | 11 |
| 3C (invention) | 2000 | 0.25 | 249 | 19 | 13 |
| 3D (invention) | 4600 | 0.25 | 243 | 15 | 16 |
| 3E (invention) | 8000 | 0.25 | 193 | 6 | 34 |
| 3F (invention) | 3400 | 0.15 | 269 | 20 | 13 |
| 3G (invention) | 3400 | 0.35 | 260 | 13 | 20 |

As is apparent from the results set forth in Table 3, increasing the molecular weight of polyethylene glycol from 1000 to 8000 Daltons results in a decrease in ruthenium removal rate, but results in a greater decrease in oxide removal rate relative to ruthenium. The highest ratio of ruthenium to oxide removal rate at 34 was observed with polyethylene glycol having a molecular weight of 8000 Daltons (Polishing Composition 3E). However, with the polyethylene glycol having a molecular weight of 8000 Daltons, the ruthenium removal rate was approximately 30% lower than the ruthenium removal rate for control. These results suggest that there may be an upper limit to the molecular weight for polyethylene glycols useful in the inventive method.

Further, ruthenium removal rates observed for polishing compositions with the concentration of polyethylene glycol having a molecular weight of 3400 Daltons increasing from 0.15 wt. % to 0.35 wt. % (Polishing Compositions 3F and 3G) were approximately 5% less than that of the control polishing composition. However, the ratio of ruthenium to oxide removal rates increased over the concentration range to approximately 233% greater than the ratio observed for the control polishing composition.

Example 4

This example compares the ruthenium and oxide removal rates achievable by the polishing method of the invention as compared to a polishing method involving the use of polishing compositions containing polyvinyl alcohol or a control polishing composition.

Similar substrates comprising ruthenium and silicon dioxide were polished with different polishing compositions. Five different polishing compositions were used to chemically-mechanically polish the substrates (Polishing Compositions 4A, 4B, 4C, 4D, and 4E). Each polishing composition was mixed at the substrate via delivery of two separate flow streams to the substrate. The first flow stream consisted of 5 wt. % Degussa MOX-80 abrasive particles (1% alumina-doped silica) dispersed in water at a pH of 4, and was delivered at a flow rate of 50 mL/min. The second flow stream consisted of a 6.25 wt. % solution of $KBrO_3$ in water at a pH of 2, and was delivered at a flow rate of 150 mL/min. Polishing Composition 4A (control) did not contain any other components. The remaining polishing compositions additionally contained an additive (e.g., polyethylene glycol or polyvinyl alcohol) delivered via the first flow stream. The comparative polishing compositions additionally contained varying amounts of a polyvinyl alcohol with a molecular weight range of 9000-1000 Daltons. Polishing Composition 4B (comparative) additionally contained 0.15 wt. % polyvinyl alcohol. Polishing Compositions 4B, 4C, and 4D (comparative) additionally contained 0.5 wt. %, 1.25 wt. %, and 2.5 wt. % polyvinyl alcohol, respectively. Polishing Composition 4E (invention) contained 1.25 wt. % of polyethylene glycol with a molecular weight of 8000.

Following use of the polishing compositions, the ruthenium removal rate (Ru RR) and silicon dioxide removal rate (oxide RR) were determined for both of the chemical-mechanical polishing compositions. The results are summarized in Table 4.

TABLE 4

Comparison of Polyethylene Glycol and Polyvinyl Alcohol as Polishing Additives

| Polishing Composition | Ru RR (Å/min) | Oxide RR (Å/min) | Selectivity Ru/Ox |
|---|---|---|---|
| 4A (control) | 263 | 90 | 3 |
| 4B (comparative) | 140 | 29 | 5 |
| 4C (comparative) | 74 | 28 | 3 |
| 4D (comparative) | 19 | 36 | 1 |
| 4E (invention) | 204 | 15 | 13 |

As is apparent from the results set forth in Table 4, polishing compositions containing polyvinyl alcohol exhibited greatly reduced removal rates for both ruthenium and oxide, with only an approximately 1.7-fold improvement in the ratio of ruthenium to oxide removal rate at the lowest polyvinyl alcohol loading. By way of contrast, the polishing composition containing an ethylene oxide-containing polymer exhibited an approximately 22% decrease in the ruthenium removal rate but allowed for an approximately 4.3-fold increase in the ratio of ruthenium to oxide removal rate.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A method of polishing a substrate comprising:
   (i) contacting a substrate comprising a noble metal and silicon oxide on a surface of the substrate, wherein the noble metal is selected from the group consisting of ruthenium, iridium, platinum, palladium, osmium, rhenium, silver, gold, nitrides thereof, oxides thereof, alloys thereof, and combinations thereof, with a chemical-mechanical polishing system comprising:
      (a) a polishing component selected from the group consisting of an abrasive, a polishing pad, and a combination thereof,
      (b) an oxidizing agent selected from the group consisting of bromates, bromites, hypobromites, chlorates, chlorites, hypochlorites, perchlorates, hypoiodites, periodates, monoperoxy sulfate, organo-halo-oxy compounds, rare earth salts, and combinations thereof,
      (c) an ethylene-oxide containing polymer having the structure $R(CH_2CH_2O)_nR'$, wherein R is selected from OH, OR", and R", and wherein R' is selected from H or R", wherein R" is H or lower alkyl, and wherein n is an integer from about 150 to about 250, and wherein the ethylene-oxide containing polymer suppresses the removal rate of the silicon oxide, and
      (d) a liquid carrier, and
   (ii) abrading at least a portion of the noble metal with the chemical-mechanical polishing system to polish the substrate.

2. The method of claim 1, wherein the chemical-mechanical polishing system has a pH of about 4 or less.

3. The method of claim 2, wherein the chemical-mechanical polishing system has a pH of about 1 to about 4.

4. The method of claim 1, wherein the chemical-mechanical polishing system comprises about 0.1 wt. % to about 10 wt. % of the oxidizing agent based on the weight of the liquid carrier and any components dissolved or suspended therein.

5. The method of claim 1, wherein the oxidizing agent is a bromate.

6. The method of claim 1, wherein the oxidizing agent is potassium hydrogen peroxymonosulfate sulfate.

7. The method of claim 1, wherein the ethylene-oxide containing polymer is a polyethylene glycol.

8. The method of claim 7, wherein the polyethylene glycol has a molecular weight of about 7500 to about 10000 Daltons.

9. The method of claim 1, wherein the ethylene-oxide containing polymer is a dialkylsiloxane-ethylene oxide block copolymer.

10. The method of claim 1, wherein the chemical-mechanical polishing system comprises an abrasive suspended in a liquid carrier, and the abrasive is selected from the group consisting of alumina, silica, ceria, zirconia, titania, germania, diamond, and combinations thereof.

11. The method of claim 10, where the abrasive comprises silica doped with alumina.

12. The method of claim 1, wherein the substrate comprises silicon oxide.

13. The method of claim 1, wherein the noble metal is ruthenium.

14. The method of claim 1, wherein the liquid carrier comprises water.

15. The method of claim 1, wherein the chemical-mechanical polishing system further comprises an abrasive that is affixed to a polishing pad.

16. The method of claim 1, wherein the chemical-mechanical polishing system further comprises a complexing agent.

17. The method of claim 16, wherein the complexing agent is selected from the group consisting of ethylenediaminetetraacetic acid, nitrogen-containing crown ethers, citric acid, chloride ligands, bromide ligands, cyanide ligands, and phosphine ligands.

18. The method of claim 1, wherein the chemical-mechanical polishing system further comprises a pH buffering agent.

* * * * *